(12) United States Patent
Gorobets et al.

(10) Patent No.: US 9,043,537 B1
(45) Date of Patent: *May 26, 2015

(54) UPDATE BLOCK PROGRAMMING ORDER

(71) Applicant: SanDisk Technologies Inc., Plano, TX (US)

(72) Inventors: Sergey Anatolievich Gorobets, Edinburgh (GB); Chris Avila, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/086,162

(22) Filed: Nov. 21, 2013

(51) Int. Cl.
*G06F 12/02* (2006.01)
*G11C 11/56* (2006.01)

(52) U.S. Cl.
CPC .... *G06F 12/0246* (2013.01); *G06F 2212/7201* (2013.01); *G11C 11/5628* (2013.01)

(58) Field of Classification Search
CPC .................. G06F 12/0246; G11C 11/5628
USPC .............................. 711/103, 209; 365/185.03
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,774,397 A | 6/1998 | Endoh et al. | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,016,226 B2 | 3/2006 | Shibata et al. | |
| 7,057,939 B2 | 6/2006 | Li et al. | |
| 7,120,051 B2 | 10/2006 | Gorobets et al. | |
| 7,315,916 B2 | 1/2008 | Bennett et al. | |
| 7,505,320 B2 | 3/2009 | Li | |
| 7,508,721 B2 | 3/2009 | Li et al. | |
| 7,594,157 B2 | 9/2009 | Choi et al. | |
| 7,755,950 B2 | 7/2010 | Yu et al. | |

(Continued)

FOREIGN PATENT DOCUMENTS

| WO | WO2012087411 | 6/2012 |
| WO | WO 2012/158521 | 11/2012 |
| WO | WO2012174216 | 12/2012 |

OTHER PUBLICATIONS

Office Action for U.S. Appl. No. 14/286,262 mailed Sep. 10, 2014, 20 pages.

(Continued)

*Primary Examiner* — Gary W Cygiel
(74) *Attorney, Agent, or Firm* — Davis Wright Tremaine LLP

(57) ABSTRACT

Certain MLC blocks that tend to be reclaimed before they are full may be programmed according to a programming scheme that programs lower pages first and programs upper pages later. This results in more lower page programming than upper page programming on average. Lower page programming is generally significantly faster than upper page programming so that more lower page programming (and less upper programming) reduces average programming time.

8 Claims, 16 Drawing Sheets

(56) References Cited

U.S. PATENT DOCUMENTS

| | | |
|---|---|---|
| 7,951,669 B2 | 5/2011 | Harari et al. |
| 8,027,195 B2 | 9/2011 | Li et al. |
| 8,046,528 B2 | 10/2011 | Chu et al. |
| 8,094,400 B1 | 1/2012 | Han |
| 8,144,512 B2 | 3/2012 | Huang et al. |
| 8,214,700 B2 | 7/2012 | Chen |
| 8,244,960 B2 | 8/2012 | Paley et al. |
| 8,307,241 B2 | 11/2012 | Avila et al. |
| 8,472,280 B2 | 6/2013 | Li |
| 8,539,311 B2 | 9/2013 | Steiner et al. |
| 8,566,671 B1 | 10/2013 | Ye et al. |
| 8,750,042 B2 | 6/2014 | Sharon et al. |
| 2006/0085587 A1 | 4/2006 | Takizawa |
| 2006/0155922 A1 | 7/2006 | Gorobets et al. |
| 2007/0109858 A1 | 5/2007 | Conley et al. |
| 2008/0104309 A1 | 5/2008 | Cheon et al. |
| 2008/0273363 A1 | 11/2008 | Mouli |
| 2009/0230454 A1 | 9/2009 | Pekny |
| 2010/0042775 A1 | 2/2010 | Yeh |
| 2010/0174847 A1 | 7/2010 | Paley et al. |
| 2010/0199024 A1 | 8/2010 | Jeong |
| 2010/0318721 A1 | 12/2010 | Avila et al. |
| 2010/0318839 A1 | 12/2010 | Avila et al. |
| 2011/0072332 A1 | 3/2011 | Tomlin |
| 2011/0096601 A1 | 4/2011 | Gavens et al. |
| 2011/0099418 A1 | 4/2011 | Chen |
| 2011/0099460 A1 | 4/2011 | Dusija et al. |
| 2011/0129180 A1 | 6/2011 | Jiang |
| 2011/0149650 A1 | 6/2011 | Huang et al. |
| 2011/0153912 A1 | 6/2011 | Gorobets et al. |
| 2011/0267885 A1 | 11/2011 | Kato |
| 2012/0001247 A1 | 1/2012 | Alsmeier |
| 2012/0005415 A1 | 1/2012 | Jung et al. |
| 2012/0182803 A1 | 7/2012 | Shirakawa |
| 2012/0220088 A1 | 8/2012 | Alsmeier |
| 2012/0256247 A1 | 10/2012 | Alsmeier |
| 2012/0272120 A1 | 10/2012 | Chen |
| 2012/0287710 A1 | 11/2012 | Shirakawa |
| 2012/0297122 A1 | 11/2012 | Gorobets et al. |
| 2012/0311244 A1 | 12/2012 | Huang et al. |
| 2013/0024605 A1 | 1/2013 | Sharon et al. |
| 2013/0028021 A1 | 1/2013 | Sharon et al. |
| 2013/0031429 A1 | 1/2013 | Sharon et al. |
| 2013/0031430 A1 | 1/2013 | Sharon et al. |
| 2013/0031431 A1 | 1/2013 | Sharon et al. |
| 2013/0107628 A1 | 5/2013 | Dong et al. |
| 2013/0124787 A1 | 5/2013 | Schuette |
| 2013/0155769 A1 | 6/2013 | Li et al. |

OTHER PUBLICATIONS

Office Action for U.S. Appl. No. 14/286,616 mailed Aug. 7, 2014, 26 pages.

U.S. Appl. No. 13/929,368, entitled Efficient Post Write Read in Three Dimensional Nonvolatile Memory, filed Jun. 27, 2013, 49 pages.

U.S. Appl. No. 13/934,013, entitled Write Operations for Defect Management in Nonvolatile Memory, filed Jul. 2, 2013, 47 pages.

U.S. Appl. No. 14/086,162, entitled Update Block Programming Order, filed Nov. 21, 2013, 45 pages.

U.S. Appl. No. 14/094,550 entitled "Multi-Die Write Management," filed Dec. 2, 2013, 32 pages.

U.S. Appl. No. 14/097,523, entitled Systems and Methods for Partial Page Programming of Multi Level Cells, filed Dec. 5, 2013, 41 pages.

U.S. Appl. No. 14/099,027 entitled "Lower Page Only Host Burst Writes,", filed Dec. 6, 2013, 46 pages.

Notice of Allowance for U.S. Appl. No. 14/276,925 mailed Aug. 4, 2014, 18 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

U.S. Appl. No. 13/788,415 entitled "Write Sequence Providing Write Abort Protection," filed Mar. 7, 2013. 36 pages.

Office Action for U.S. Appl. No. 14/099,027 mailed Nov. 6, 2014, 32 pages.

Final Office Action for U.S. Appl. No. 14/286,616 mailed Feb. 27, 2015, 25 pages.

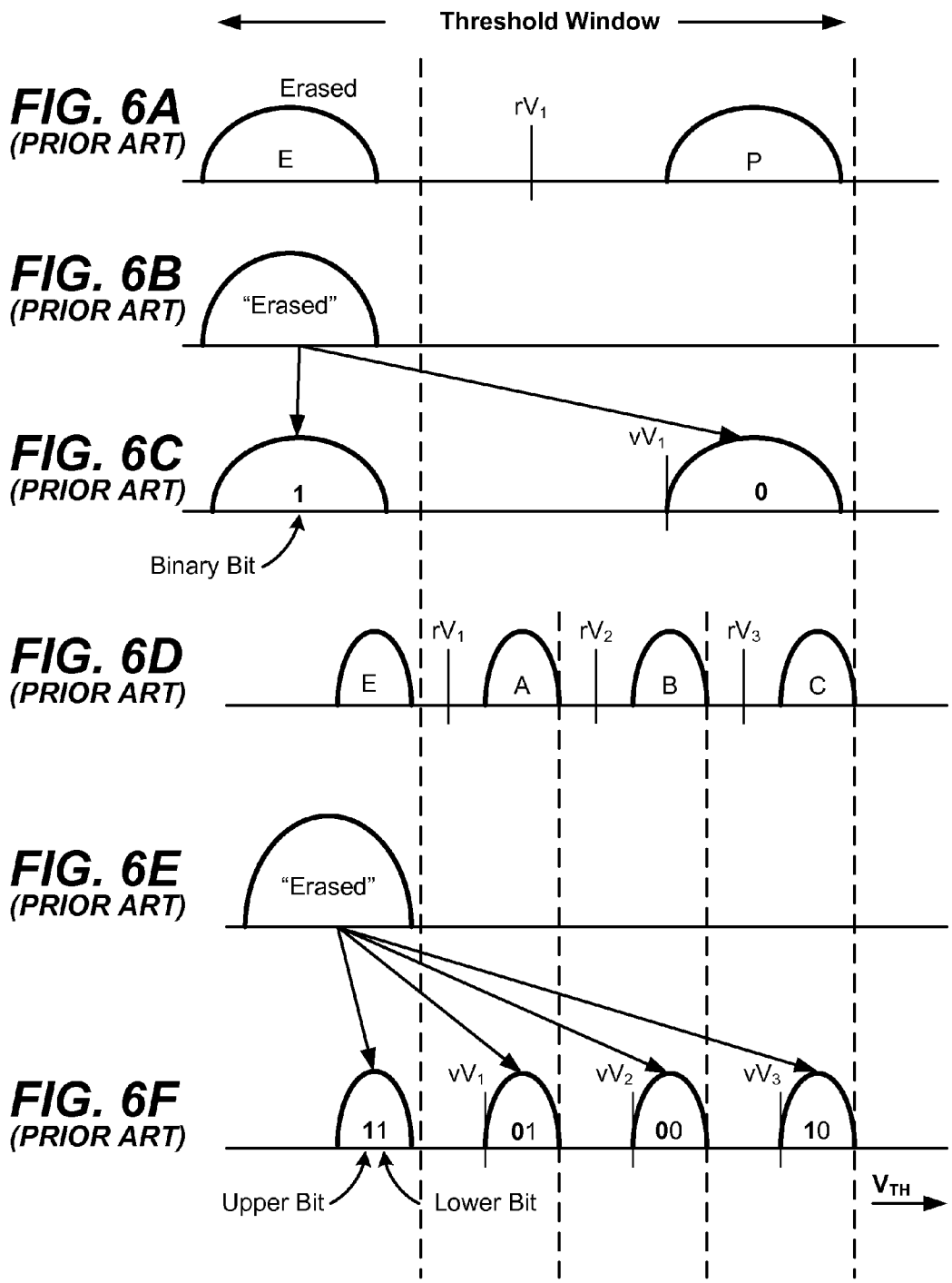

|     | LP | UP |
|-----|----|----|
| WL0 | 0  | 2  |
| WL1 | 1  | 4  |
| WL2 | 3  | 6  |
| WL3 | 5  | 8  |
| WL4 | 7  |    |
| WL5 |    |    |
| ... |    |    |
| WLK |    |    |

|     | LP | UP  |
|-----|----|-----|
| WL0 | 0  | K+1 |
| WL1 | 1  | K+2 |
| WL2 | 2  | K+3 |
| WL3 | 3  | K+4 |
| ... |... | ... |
| WLK | K  | 2K  |

|       | LP      | UP    |
|-------|---------|-------|
| WL0   | 0       | N+1   |
| WL1   | 1       | N+3   |
| WL2   | 2       | N+5   |
| WL3   | 3       | N+7   |
| ...   | ...     | ...   |
| WLN   | N       | 3N+1  |
| WLN+1 | N+2     | 3N+3  |
| WLN+2 | N+4     | 3N+5  |
| ...   | ...     |       |
| WLK   | N+(K-N)/2 | 2K  |

| | LP | UP |
|---|---|---|
| WL0 | 0 | |
| WL1 | 1 | |
| WL2 | 2 | |
| WL3 | 3 | |
| ... | ... | ... |
| WLN | N | |
| WLN+1 | FSP1 | |
| WLN+2 | FSP2 | |
| ... | ... | |
| WLK | FSP(K-N) | |
FIG. 16
| | LP | UP |
|---|---|---|
| WL0 | 0 | UP0 |
| WL1 | 1 | UP1 |
| WL2 | 2 | UP2 |
| WL3 | 3 | UP3 |
| ... | ... | ... |
| WLN | N | UPN |
| WLN+1 | | |
| WLN+2 | FSP | |
| ... | | |
| WLK | | |
FIG. 17
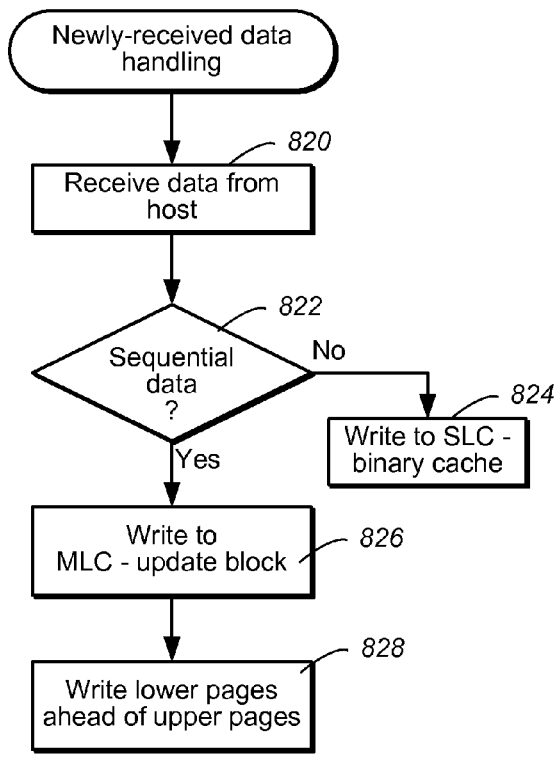
FIG. 18
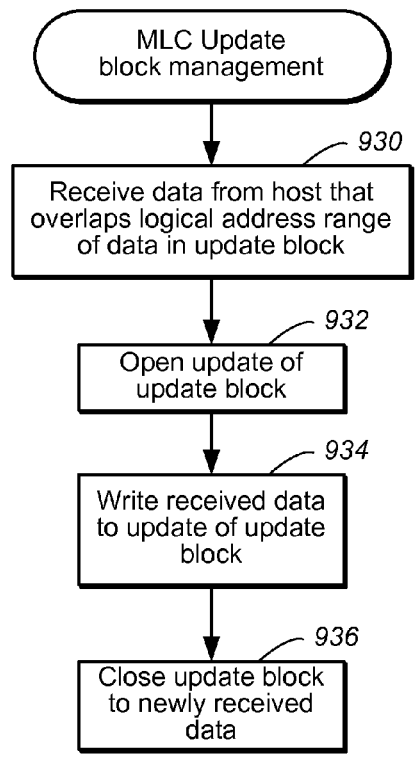
FIG. 19

UPDATE BLOCK PROGRAMMING ORDER

BACKGROUND

This application relates to the operation of re-programmable nonvolatile memory systems such as semiconductor flash memory which record data using charge stored in charge storage elements of memory cells and to methods of operating such memory systems.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY OF THE INVENTION

In certain memory systems, some Multi Level Cell (MLC) blocks tend to be reclaimed (garbage collected and erased) before they are full. Such blocks may be programmed according to a programming scheme that programs lower pages first and programs upper pages later. This results in more lower page programming than upper page programming in such blocks. Lower page programming is generally significantly faster than upper page programming so that there may be a significant time saving. In some cases all word lines in a block are programmed with lower page data before any word lines are programmed with upper page data. In other cases upper page programming begins before all lower page programming is done.

An example of a method of operating a block-erasable nonvolatile memory array includes: maintaining a plurality of Multi Level Cell (MLC) erase blocks as update blocks that are available to receive sequential data updates of host data for particular host logical address ranges; and programming newly-received host data to word lines of an individual update block in a first order in which lower page programming of the word lines of the update block precedes upper page programming of the word lines of the update block by X word lines, where X is greater than two.

The value of X may be equal to the number of word lines in the individual update block. The block-erasable nonvolatile memory array may be a three-dimensional NAND flash memory array. The method may also include: subsequent to programming a subset of word lines consisting of fewer than all word lines of the individual update block with lower page data, ceasing programming of newly received host data in the individual update block according to the first order; and subsequently copying data from outside the individual update block to unprogrammed word lines of the individual update block according to a second order in which lower page programming and upper page programming are performed together for a given word line. In the second order, lower page programming and upper page programming for the given word line may be performed together in a single-pass that brings cells along the word line from an erased condition to a condition in which an individual memory cell stores two or more bits of data. The method may include copying additional data to upper pages of word lines of the subset of word lines. The block-erasable nonvolatile memory array may be a planar NAND flash memory array and the value of X may be less than the number of word lines in the individual update block. The value of X may be four. The plurality of MLC erase blocks may store two logical pages per physical page, a lower page and an upper page. The plurality of MLC erase blocks may store three logical pages per physical page, a lower page, a middle page, and an upper page.

An example of a method of operating a block-erasable nonvolatile memory array includes: maintaining a plurality of Single Level Cell (SLC) erase blocks to receive nonsequential data updates of host data; maintaining a first plurality of Multi Level Cell (MLC) erase blocks as update blocks that are available to store newly-received sequential data updates of host data for particular host logical address ranges; and programming newly-received sequential host data to word lines of an individual update block in a first order in which lower page programming of all of the word lines precedes upper page programming of the word lines.

The method may further include: writing first sequential data to a first update block when the first sequential data is received for a first host logical address range associated with the first update block; subsequently, closing the first update block to newly-received host data and opening a second update block when second sequential data is received for a second host logical address range that overlaps the first host logical address range; and writing the second sequential data to the second update block. The first sequential data may be written entirely in lower pages of the first update block. Additional data may subsequently be copied from elsewhere in the memory array to the closed first update block.

An example of a nonvolatile memory system includes: a nonvolatile memory array that includes a plurality of Multi Level Cell (MLC) nonvolatile memory blocks that are configured as update blocks that are available to receive sequential data updates of host data for a particular host logical address range; and a write circuit that is configured to program newly-received host data to word lines of an individual update block in a first order in which lower page programming of the word lines precedes upper page programming of the word lines by X word lines, where X is greater than two.

The nonvolatile memory array may be a planar NAND flash memory array and the value of X may be less than the number of word lines in the individual update block. The value of X may be four. The nonvolatile memory array may be a three-dimensional NAND memory array. The value of X may be equal to the number of word lines in an update block. The nonvolatile memory system may further include: a copy circuit configured to copy previously stored data to unused word lines of an update block that is closed to newly-received host data in a second order in which upper page programming and lower page programming are performed together. The copy circuit may be further configured to copy previously stored data as upper page data of word lines of the update block that were previously programmed with only lower page data.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

FIGS. 6A-6F illustrate examples of programming a population of memory cells.

FIG. 16 illustrates copying of data to a partially filled block.

FIG. 17 illustrates further copying of data to a partially filled block.

FIG. 18 illustrates handling of newly-received data.

FIG. 19 illustrates management of MLC update blocks.

DETAILED DESCRIPTION

Memory System

Figure 1:
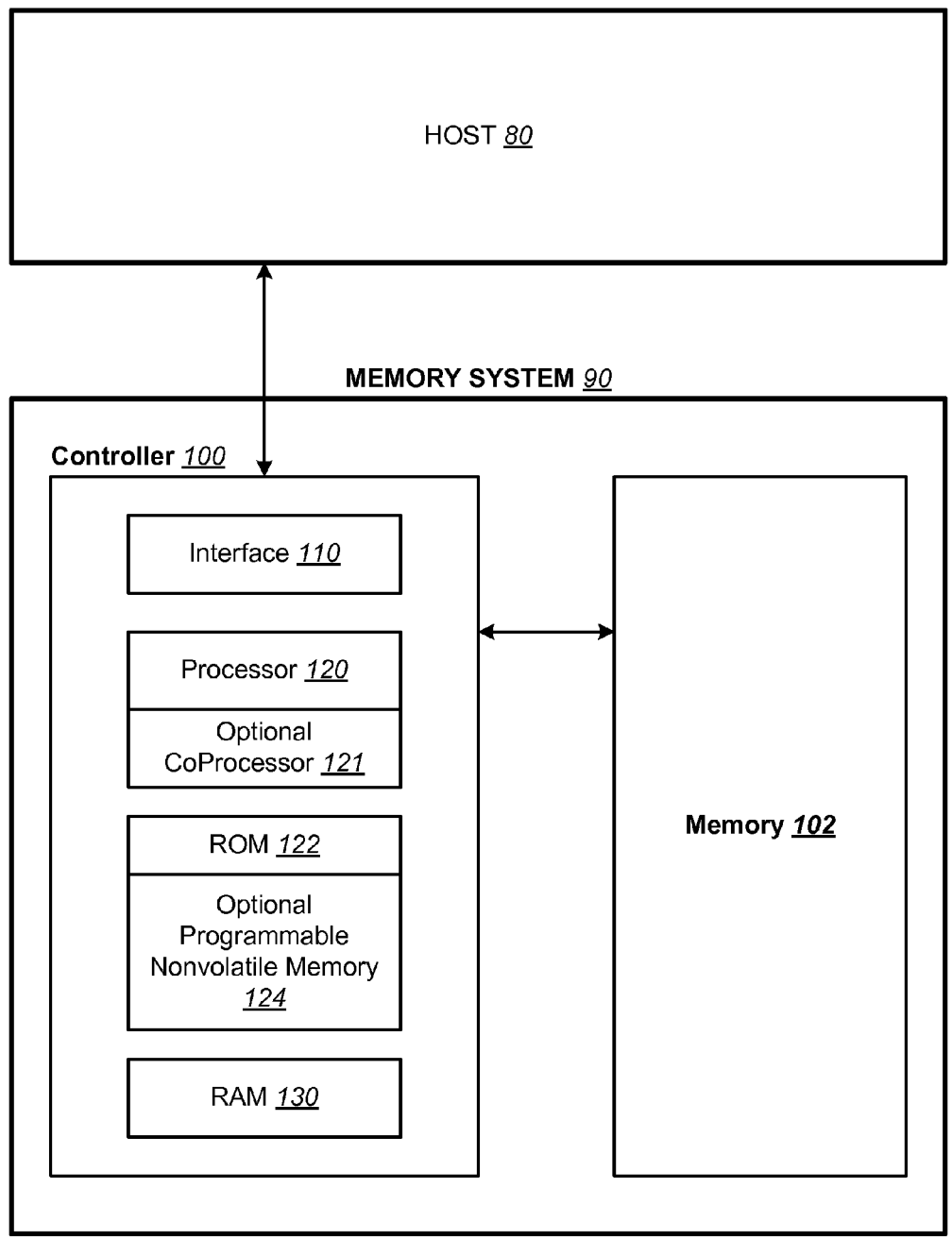
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application.

Physical Memory Structure

Figure 2:
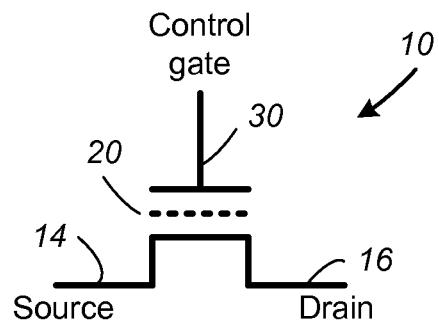
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

There are many commercially successful non-volatile solid-state memory devices being used today. These memory devices may employ different types of memory cells, each type having one or more charge storage element.

Figure 3:
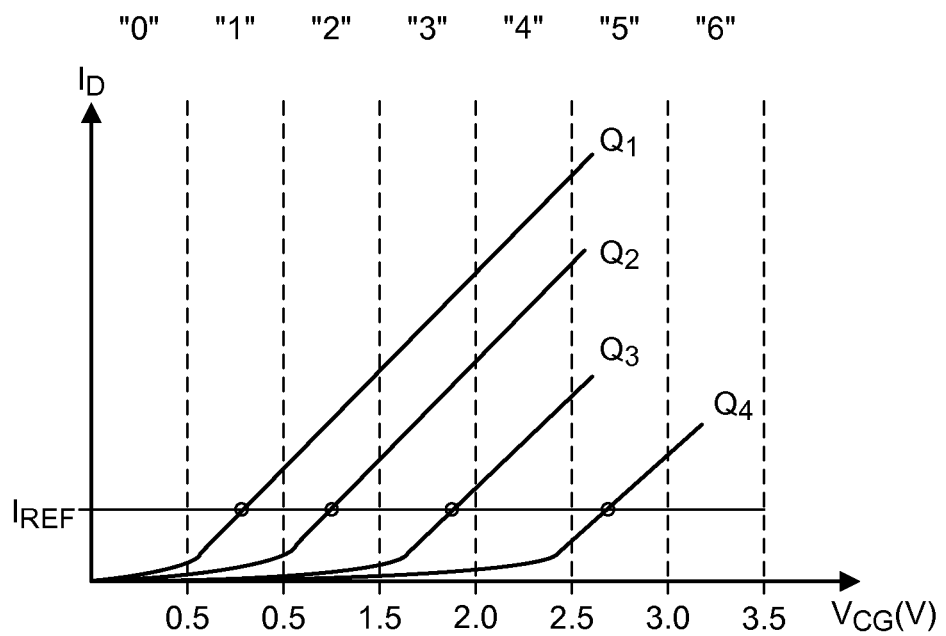
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
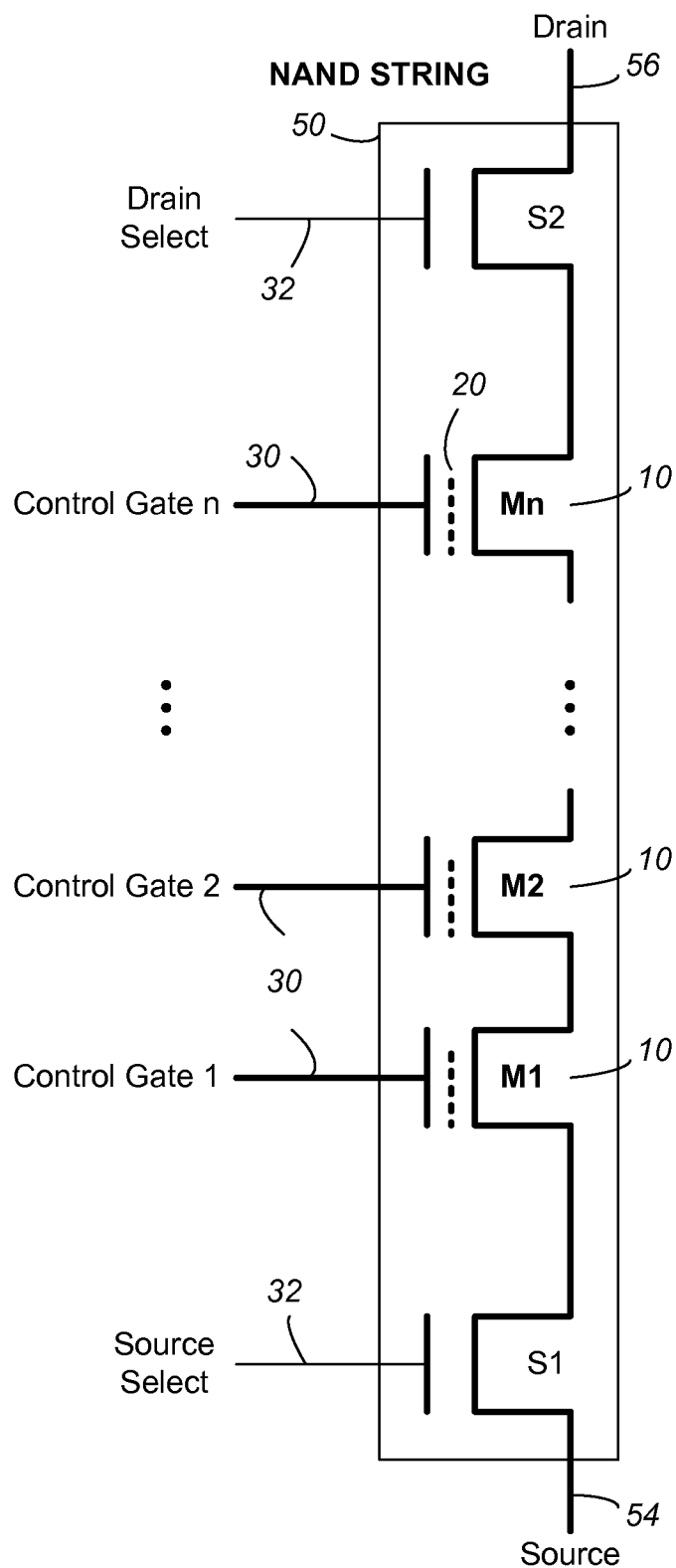
FIG. 4A illustrates schematically a string of memory cells organized into a NAND string.

FIG. 4A illustrates schematically a string of memory cells organized into a NAND string. A NAND string 50 comprises a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
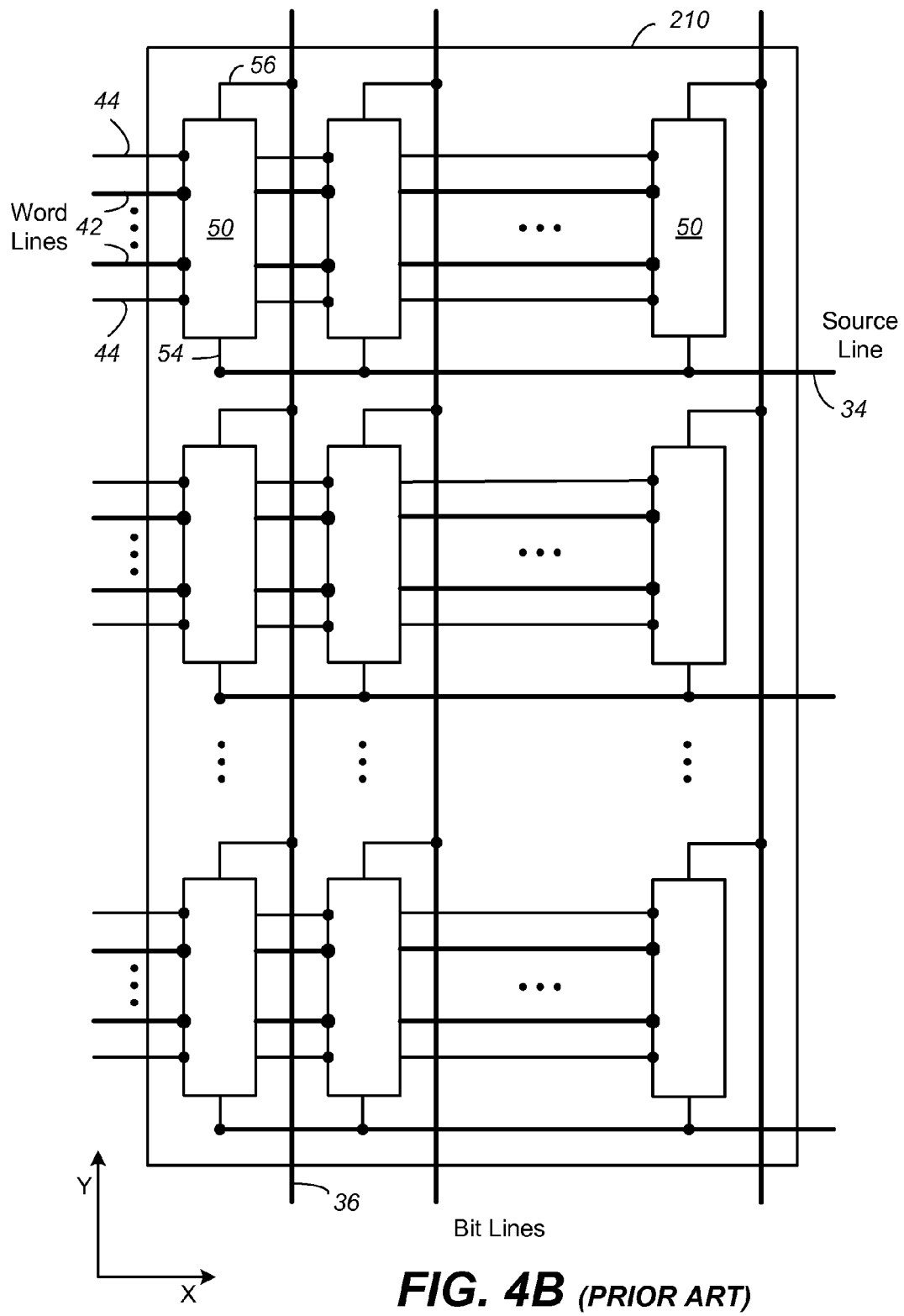
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
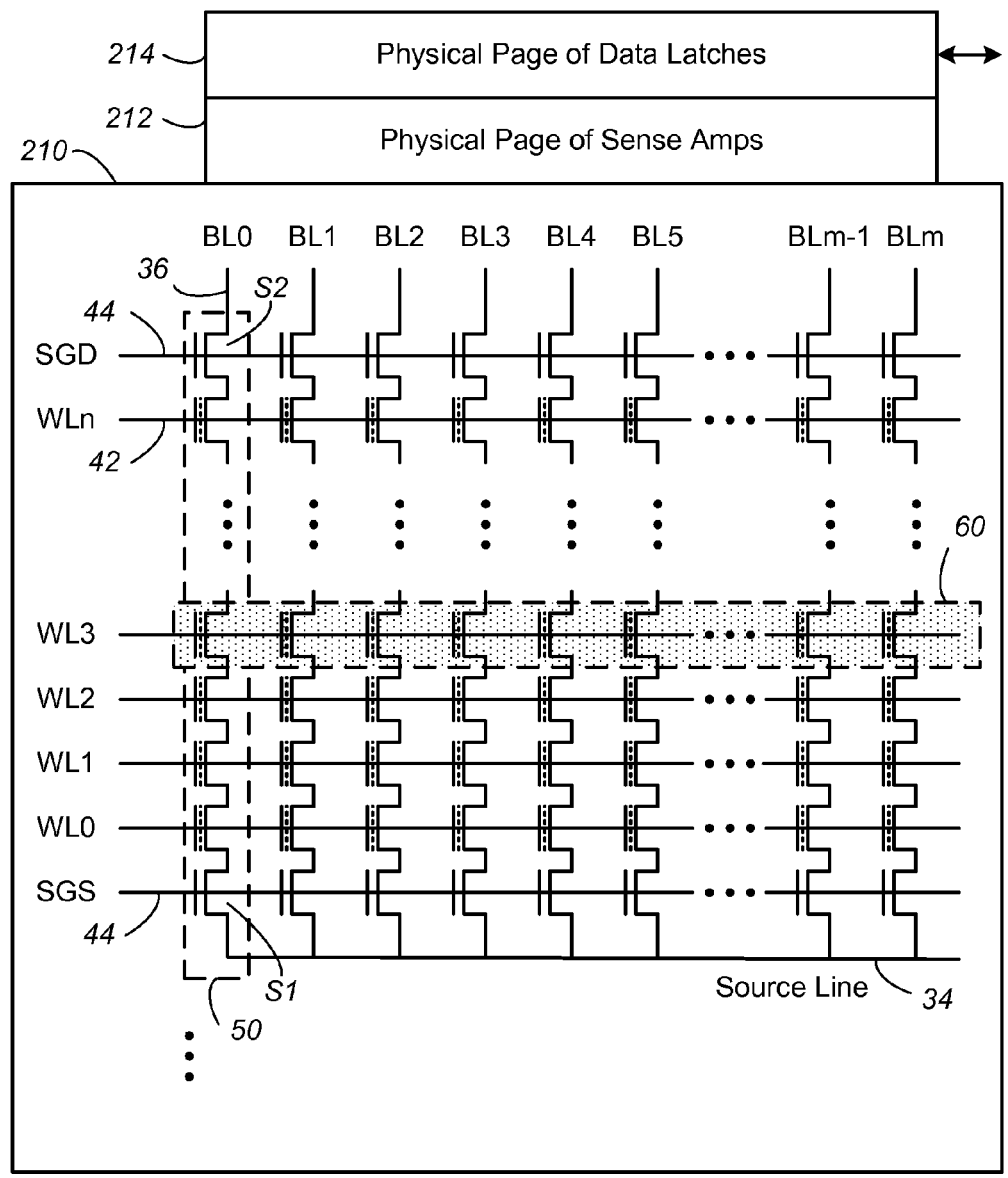
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that updated data cannot overwrite existing data and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector may include user data and overhead data.

SLC and MLC Programming

FIG. 6A-6C illustrate an example of a population of 2-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, $rV_1$. FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into a zone demarcated by verify level $vV_1$. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

FIG. 6D-6F illustrate an example of programming a population of 4-state memory cells (MLC cells). It will be understood that memory cells may be configurable as either 2-state or 4 state so that the same memory cells may be SLC at one time and MLC at another time. Typically memory cells are configured as SLC or MLC on a block by block basis so that all cells of a block are operated together as either an SLC block or an MLC block at any given time. FIG. 6D illustrates the population of memory cells programmable into four distinct distributions of threshold voltages respectively representing memory states "E", "A", "B" and "C". FIG. 6E illustrates the initial distribution of "erased" threshold voltages for an erased memory. FIG. 6F illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the erased state. As the memory gets more programming, the initial distribution of the erased state as shown in FIG. 6E will become narrower.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

While the examples above illustrate 2-state SLC operation and 4-state MLC operation, it will be understood that MLC operation is not limited to 4-state examples. For example, eight threshold voltage distributions may be used to store three bits per cell. Other numbers of threshold voltage distributions may be used to store other numbers of bits per cell.

Bit-by-Bit MLC Programming and Reading

Figure 7A:
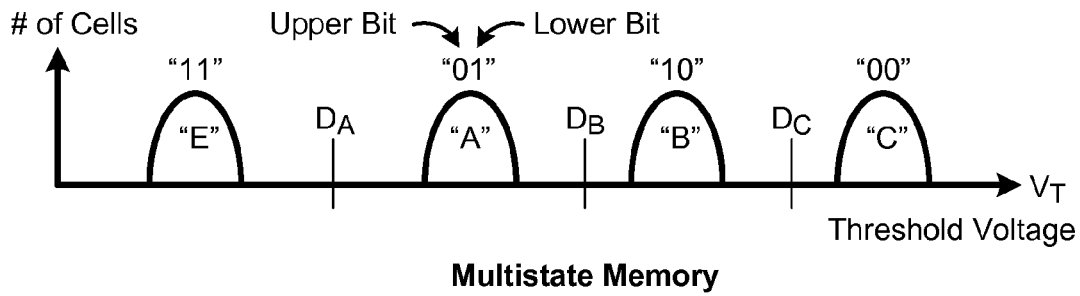
FIGS. 7A-7E illustrate programming of upper and lower page bits in MLC.

FIGS. 7A-7E illustrate the programming and reading of a 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
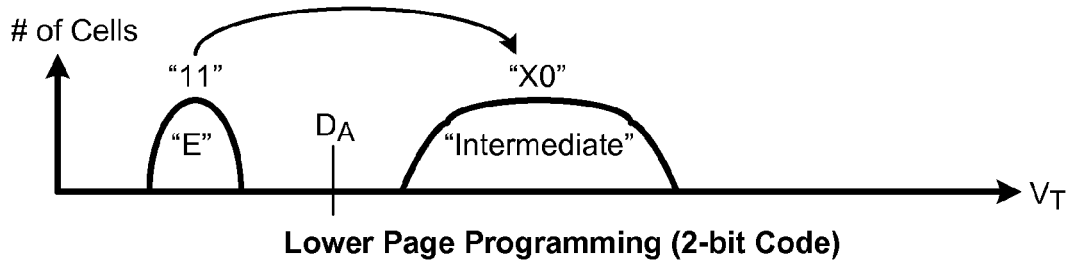

FIG. 7B illustrates the lower page programming (lower bit) in a 2-pass programming scheme using the 2-bit code. The first pass lower page programming has the logical state (upper bit, lower bit)=(1, 1) transits to some intermediate state (x, 0) as represented by programming the "unprogrammed" memory state "E" to the "intermediate" state designated by (x, 0) with a programmed threshold voltage greater than $D_A$ but less than $D_C$. Memory cells programmed with lower page bits only (no upper page bits) may be read using $D_A$.

Figure 7C:
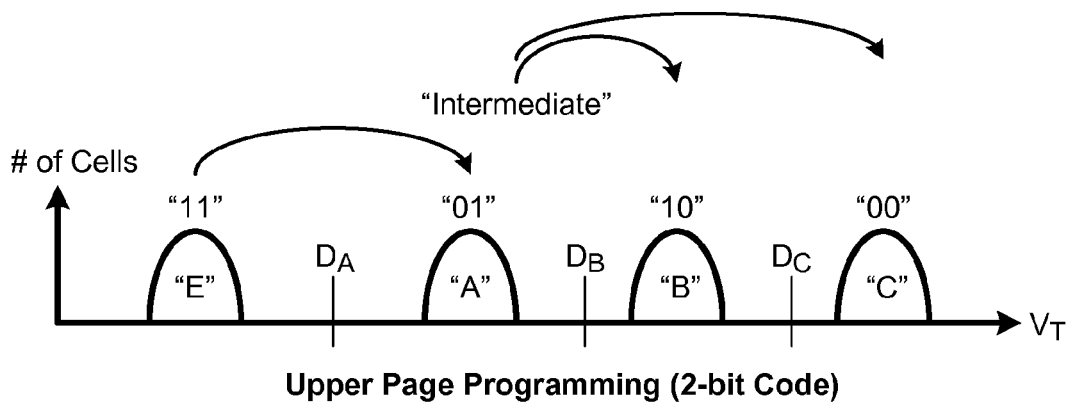

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "E" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 7D:
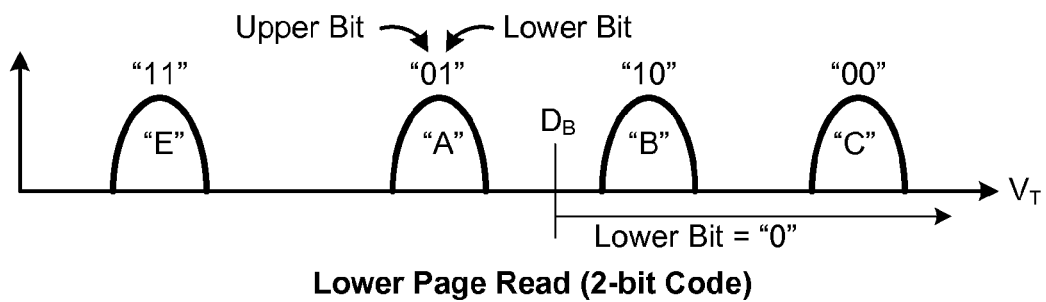

FIG. 7D illustrates the read operation that is required to discern the lower bit of the 4-state memory encoded with the 2-bit code. If the upper page has been programmed then a read operation using $D_B$ will yield the lower page data correctly. On the other hand, if the upper page has not yet been programmed, the lower page data should be read by a read operation using $D_A$.

Figure 7E:
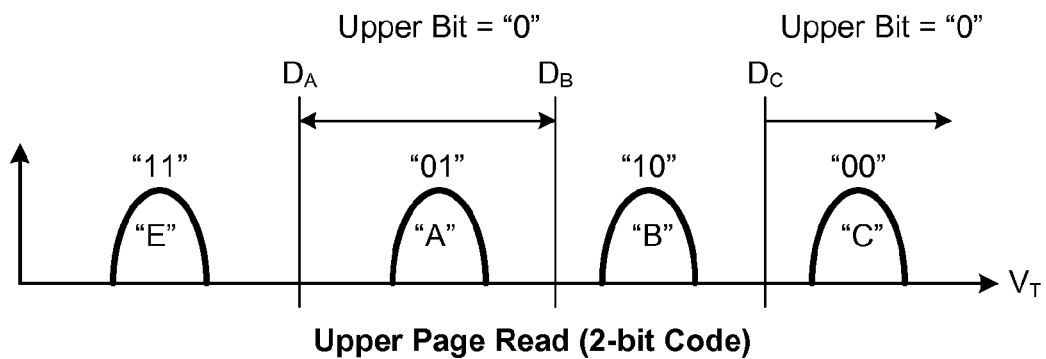

FIG. 7E illustrates the read operation that is required to discern the upper bit of the 4-state memory encoded with the 2-bit code. As is clear from the figure, the upper page read will require a 3-pass read relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page. For example, where memory cells store three bits per cell (using eight states), a physical page of memory cells may store three logical pages, a lower page, a middle page, and an upper page.

Comparing the lower page programming of FIG. 7B with the upper page programming of FIG. 7C shows some important differences. Lower page programming raises threshold voltages less than upper page programming (i.e. the intermediate state is not as high as B and C states). Also, the intermediate distribution is broad so that programming does not have to be very precise. Accordingly, lower page programming may be performed more rapidly than upper page programming. Reading of data stored as lower page only (no upper page data) may also be quicker than reading upper page data because a single read (single discrimination voltage, e.g. FIG. 7B) may provide lower page data while three reads (three discrimination voltages, e.g. FIG. 7E) may be needed to obtain upper page data.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088 and in U.S. Patent Publication Number 2013/0107628, which are hereby incorporated by reference in their entirety.

Figure 8B:
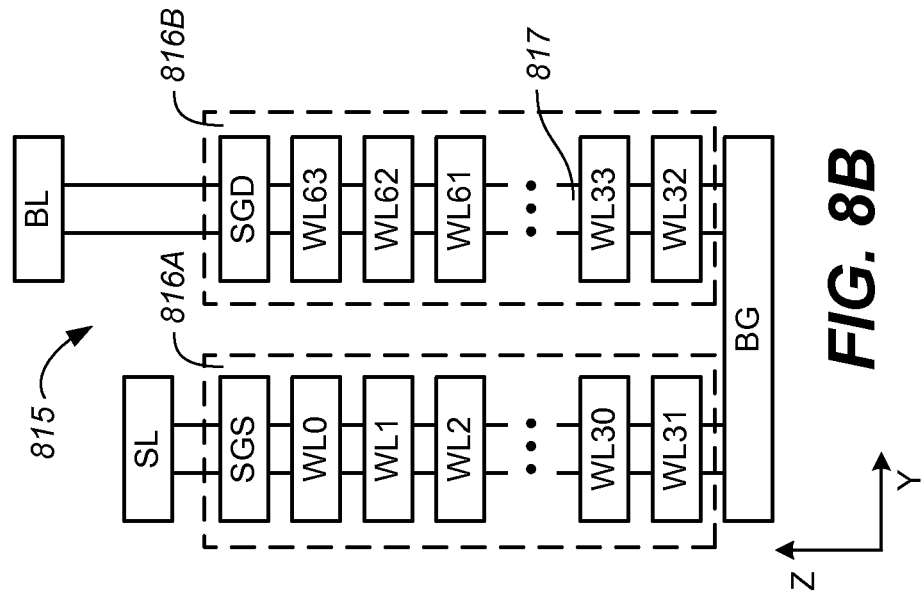
FIG. 8B shows an example of a physical structure of a U-shaped 3-D NAND string.
Figure 8A:
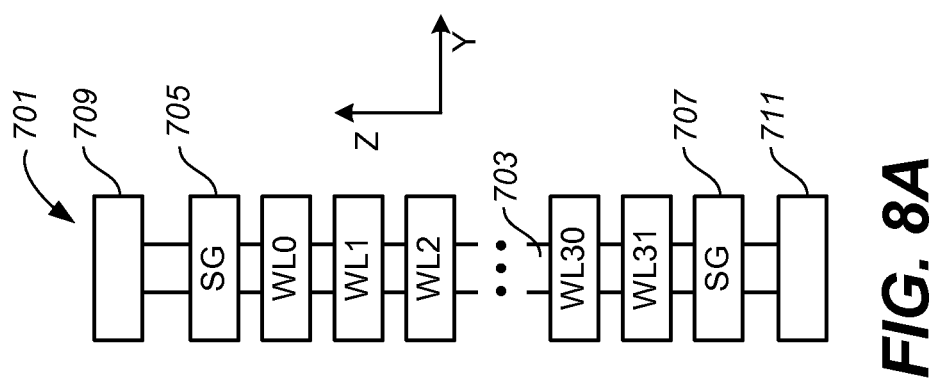
FIG. 8A shows an example of a physical structure of a 3-D NAND string.

FIG. 8A shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709.

711. Such external elements are generally conductive lines such as common source lines or bit lines that serve large numbers of NAND strings. Vertical NAND strings may be operated in a similar manner to planar NAND strings and both SLC and MLC operation is possible. While FIG. 8A shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8B shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9A:
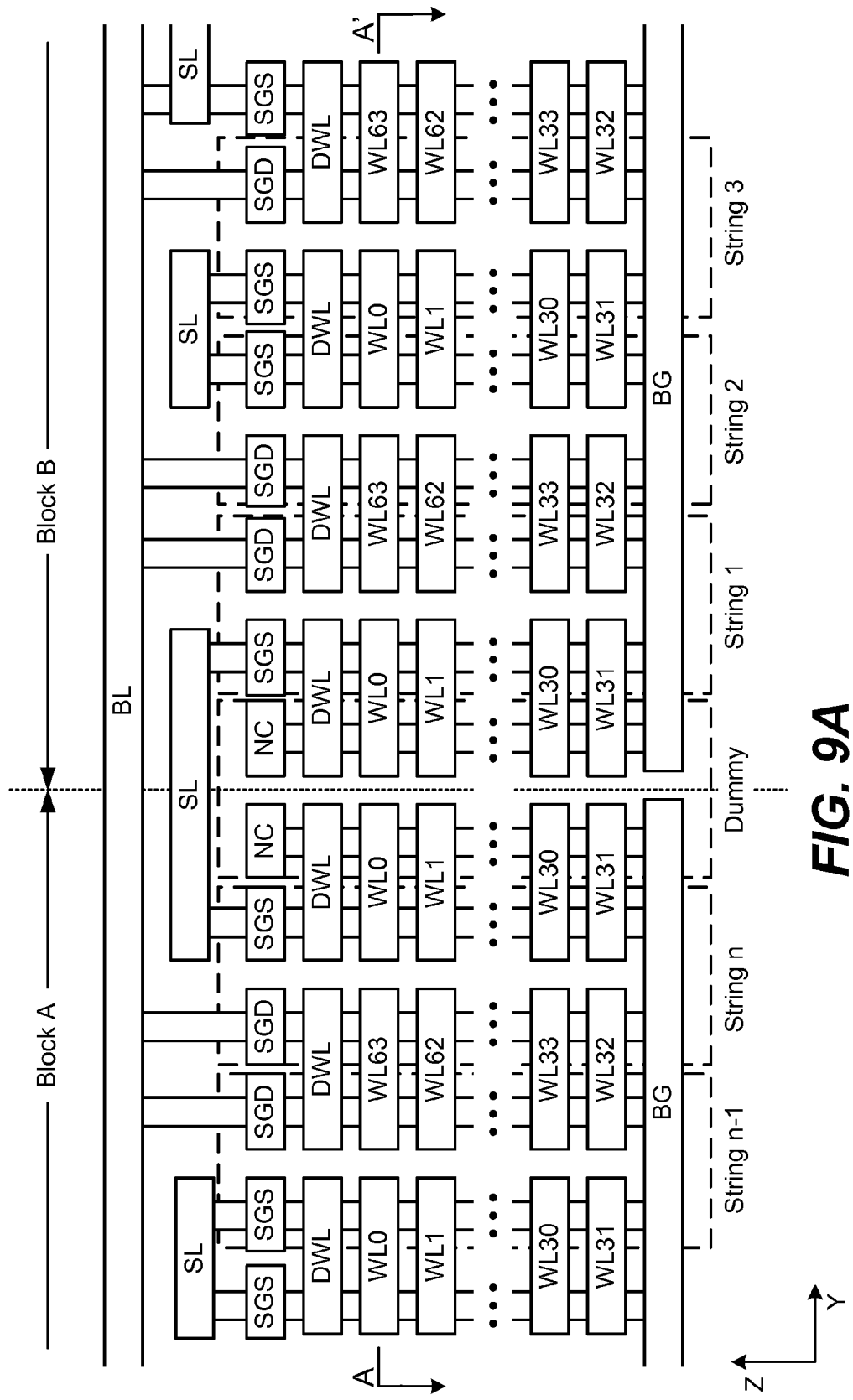
FIG. 9A shows a cross section of a 3-D NAND memory array in the y-z plane.

Vertical NAND strings may be arranged to form a 3-D NAND array in various ways. FIG. 9A shows an example where multiple U-shaped NAND strings in a block are connected to a bit line. In this case, there are n strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Figure 9B:
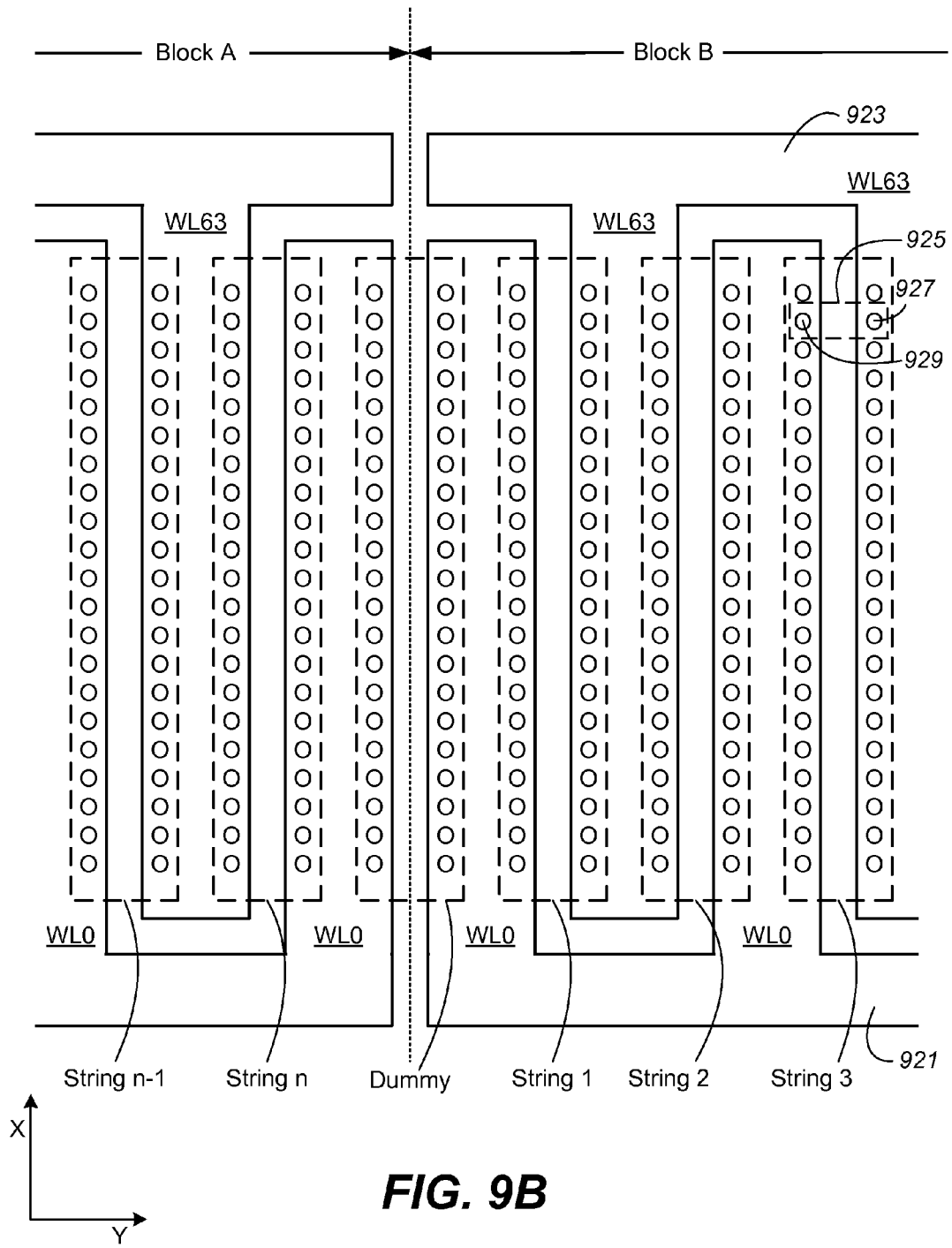
FIG. 9B shows a cross section of the 3-D NAND memory array of FIG. 9A along the x-y plane.

The 3-D NAND memory array of FIG. 9A is further illustrated in FIG. 9B, which shows a cross section along A-A' of FIG. 9A (i.e. along the x-y plane that intersects WL0 and WL63). It can be seen that word lines of a block are formed of strips of conductive material that are connected together. Thus, all word lines marked WL0 in different strings of a block are electrically connected together and are formed from a single electrically conductive body 921. Similarly, all word lines marked WL63 in different strings of a block are electrically connected together and are formed from a single electrically conductive body 923. The two bodies that form word lines of a block on a given level appear as interdigitated fingers extending from opposite sides of the block. These two bodies may be separated by Shallow Trench Isolation (STI) dielectric, or by any suitable insulator. A similar pattern may be found at each level of word lines (e.g. WL1 and WL62 are similarly interdigitated, as are WL2 and WL61, and so on). Word lines of different blocks are isolated from each other. Thus, WL0 of Block A is separate, and electrically isolated from WL0 of Block B. Similarly, WL63 of Block A is separate, and electrically isolated from WL0 of Block B.

SLC and MLC Operation

In both two dimensional and three dimensional memories, it is common to operate some blocks in a memory array in an SLC block and others in an MLC block. For example, data that is expected to be stored for a relatively long period without updates may be stored in MLC blocks while data that is likely to be frequently updated may be stored in SLC. Blocks may be configured as SLC or MLC according to requirements.

Figure 10:
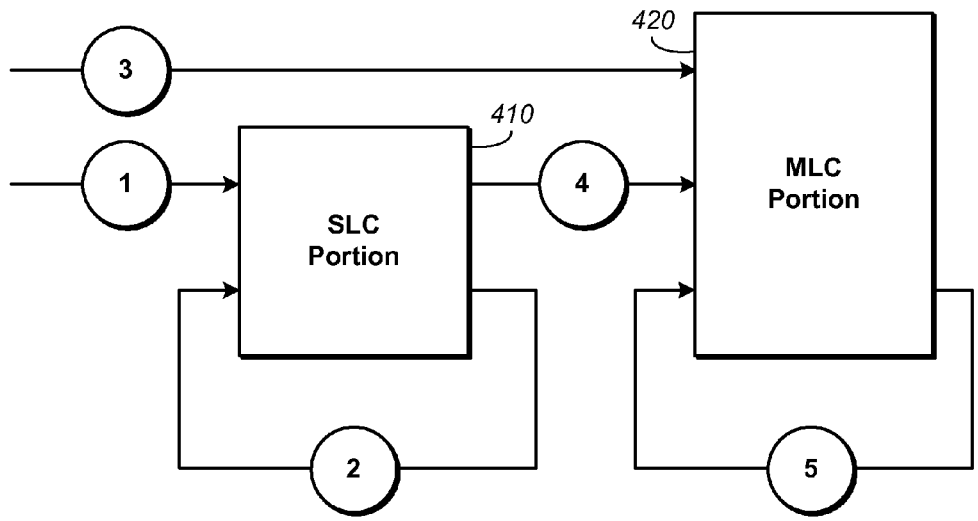
FIG. 10 illustrates operation of SLC and MLC portions in a memory system.

FIG. 10 illustrates schematically the data path between an SLC portion and an MLC portion in an example of a memory that has both SLC blocks and MLC blocks. This may be considered a two layer system. The first layer is the main input buffer for incoming data and operates on the SLC portion 410 of a NAND memory which is faster/higher-endurance/higher-cost memory compared to the MLC portion 420. The second layer is the main data archive storage and operates on the MLC portion which is slower/lower-endurance/lower-cost memory.

The main operations in such system are labeled in FIG. 10 are as follows:

1. Host data or control data write to SLC portion
2. Data copy within SLC portion to reclaim partially obsolete SLC block, sometimes referred to as 'compaction'
3. Host data direct write to MLC portion, usually used for long sequential writes
4. Data move from SLC to MLC portion, sometimes referred to as 'folding'
5. Data copy within MLC portion for MLC block reclaim, sometimes referred to as 'MLC compaction'

The above structure can be built with many other additional features, mainly related to the use of different addressing schemes and addressable data unit granularity.

Figure 11:
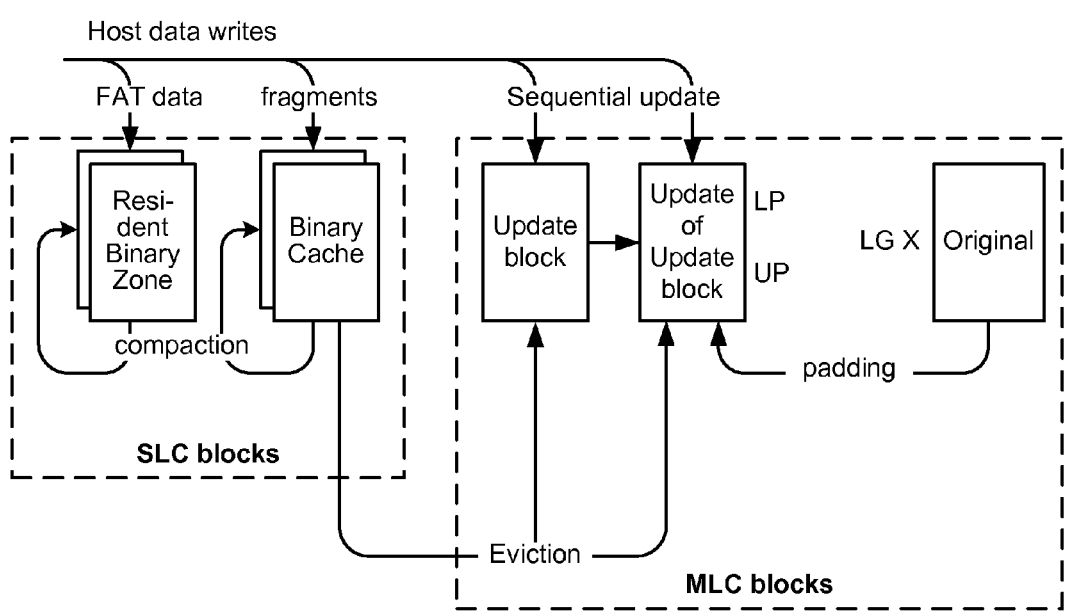
FIG. 11 illustrates a detailed example of operation of SLC and MLC portions.

FIG. 11 shows a more detailed example of a memory that includes SLC blocks and MLC blocks. Certain data, including memory management data such as File Allocation Table data ("FAT" data) is always maintained in SLC in this example because it is frequently updated. Short fragments of data are also initially stored in SLC blocks. Later such data may be evicted to MLC for longer term storage. Longer portions of sequential data are initially stored in MLC blocks called update blocks. An update block may be maintained for a particular logical address range. If data that is stored in an update block is updated with new data from the host then the newly received data may be written in an update of update block. This makes data in the update block obsolete. The update block is closed and any valid data may be consolidated in the update of update block. The update block may then be erased and the update of update block becomes an update block. Data in such update blocks may be maintained in sequential order. A full update block may become an original block which is used for long term storage of data. Detailed examples of different ways to manage SLC blocks and MLC blocks are described in U.S. Pat. No. 8,094,500, and in U.S. Patent Application Publication No. 2012/0277122.

In an MLC block, lower page and upper page data may be written in different ways. The order of programming lower and upper logical pages along word lines may be important in several respects. Various interactions between cells along adjacent word lines may occur during programming. These interactions may vary according to memory design. For example, planar and three dimensional memories may have very different interactions. In particular, programmed cells along a word line may be affected by later programming along a neighboring word line.

Figures 12, 13, 14, 15:
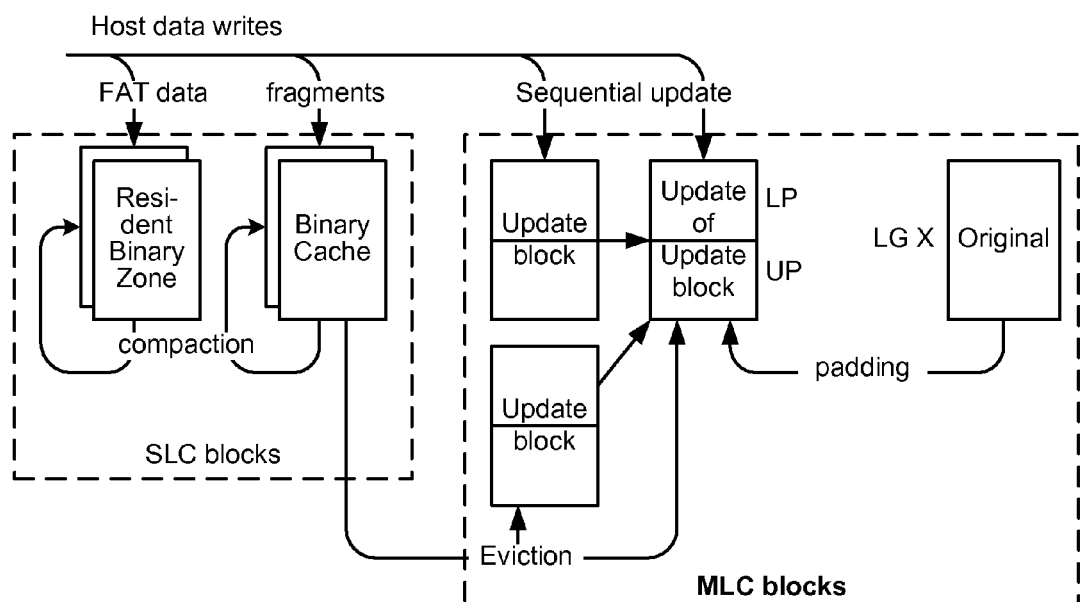
FIG. 12 shows an example of a programming scheme.
FIG. 13 shows an alternative example of a programming scheme.
FIG. 14 shows another alternative example of a programming scheme.
FIG. 15 illustrates an example of how programming schemes of FIGS. 13-14 may be applied.

FIG. 12 illustrates a programming scheme in which lower page data is programmed one word line ahead of upper page data. Entries in columns for Lower Page "LP" and Upper Page "UP" show the order in which lower and upper page programming occur along word lines WL0-WLK (where K is the number of word lines in the block). These may correspond to logical addresses of sequential data received from a host (i.e. entries 0-8 represent sequential logical pages 0-8 received from a host). First, the lower page of WL0 is programmed "0," then, instead of programming the upper page of WL0, the lower page of WL1 is programmed "1." Only after the lower page of WL1 is programmed does the programming scheme return to WL0 to program the upper page "2."

While the scheme illustrated in FIG. 12 may be suitable for many situations, and may provide relatively little disturbance during programming, it may not be optimal for all MLC blocks. In particular, it has been found that MLC blocks used for certain applications are often reclaimed (compacted or garbage collected) before they are full. In the scheme of FIG. 12, this may mean fully programming certain word lines (with upper and lower page data), while other word lines remain unprogrammed. This is not ideal for all applications. It will be understood that this is simply one example of an MLC block that is likely to be reclaimed before it is full.

According to an aspect of the present invention, MLC blocks that are likely to be reclaimed before they are full may be programmed using a programming scheme that programs lower pages of all word lines first and only programs upper pages after all lower pages are programmed.

FIG. 13 shows an example of a programming scheme that programs lower pages of all word lines of a block (WL0-WLK) before programming any upper pages. Lower page programming proceeds from WL0 to WLN and only then does upper page programming begin at WL0. Entries in the table of FIG. 13 indicate the order in which programming occurs. This is not necessarily the logical order of the data (though it may reflect the logical order if the data is sequential). Because lower page programming is faster than upper page programming this may save significant time. For example, for a block that is half full when it is reclaimed (containing K logical pages of data), the scheme of FIG. 13 would program lower pages of all K word lines but would not program any upper pages. The total programming time would be approximately $K*T_{LP}$ where $T_{LP}$ is the time to program a lower page. In contrast, programming K logical pages in the example of FIG. 12 would program upper and lower pages of approximately half of the word lines K/2 (in reality, one or two word lines would contain lower page data only). The total programming time would be $K/2*T_{LP}+K/2*T_{UP}$. This represents an increase of $K/2*(T_{UP}-T_{LP})$. Because upper page programming is significantly slower than lower page programming this may be a significant time saving. For example, where $T_{UP}$ is approximately $3*T_{LP}$ the time saved is $K/2*(3*T_{LP}-T_{LP})=K*T_{LP}$. Thus, the total programming time for a half-full MLC block using the scheme of FIG. 13 is half the programming time for the same data using the scheme of FIG. 12.

It will be understood that not all blocks are filled exactly half way. Some may be reclaimed before they reach half-full. The time saving for such cases by programming lower pages first is still significant (approximately half what it would have been using an alternating scheme like FIG. 12). Some blocks may be more than half filled in which case some upper page programming occurs. The time saving depends on the amount of upper page programming that is performed before the block is reclaimed. If the block is filled, or nearly filled (all or most upper pages programmed) then there is little or no time saving. However, even if there is little or no time saving for some blocks, the system of FIG. 13 may provide significant time saving when aggregated over blocks that are reclaimed at different stages. It is not required to save time on every single block in order to benefit from this scheme. By using faster, lower page capacity first, and only using slower, upper page capacity later, overall speed is increased because overall use shifts to faster, lower pages, and shifts away from slower, upper pages. Reading may also be faster because the number of blocks that contain only lower page data when they are consolidated increases. Data can be more rapidly copied from such blocks because only lower page reading is required (no upper page read).

While the above example is directed to a 2-bit per cell memory that stores two logical pages in each physical page, a similar approach may be applied to any MLC memory. For example, in a memory that stores one or more middle pages (e.g. an 8-state, 3-bit per cell memory, that stores a lower, middle, and upper page in each physical page), the lower pages may be programmed first. Then, the one or more middle pages may be programmed after all lower pages are programmed. If there are multiple middle pages (e.g. 4-bits per cell, 4 logical pages per physical page) the middle pages may be filled after the lower pages (i.e. lower middle page filled first, then upper middle page). Only after middle pages are filled are the upper pages programmed. In general, the higher level pages take more time to program. Programming logical pages in order from fastest to slowest ensures that fast capacity is more heavily used and slow capacity is less heavily used because blocks are frequently reclaimed before they are completely filled.

While the example of FIG. 13 shows filling of all lower pages prior to programming any upper pages, some time-saving can be achieved even where upper page programming begins before all lower pages are full. In general, where lower page programming precedes upper page programming to a significant degree this tends to shift overall use from slower, upper pages to faster, lower pages. According to an aspect of the present invention, lower page programming may precede upper page programming by a number of word lines that is less than the number of word lines in the block but still sufficient to provide a time saving.

FIG. 14 shows an example of a programming scheme in which lower page programming precedes upper page programming by N word lines. Initially, lower pages of WL0-WLN are programmed with logical pages 0-N (data in this example is sequential). Then, instead of continuing to program only lower pages, the programming scheme programs logical page N+1 as an upper page of WL0. The next logical page, N+2 is programmed as a lower page to WLN+1. Then, N+3 is programmed as an upper page on WL1, and so on, alternating between lower and upper pages as in FIG. 12, but with lower page programming preceding upper page programming by N word lines. When the lower page of the last word line WLK is programmed, the scheme continues to program upper pages of WL(K-N) to WLK. The amount of time saved in this scheme depends on the value of N and how much upper page programming occurs (if any). Taking the previous example where $T_{UP}$ is approximately $3*T_{LP}$ and assuming that between N and K word lines have their lower pages programmed, the time saved is $N/2*(3*T_{LP}-T_{LP})=N*T_{LP}$.

The number N may be chosen according to characteristics of the particular memory. In some memories, it may not be possible or desirable to program all lower pages before programming upper pages. For example, some planar NAND memories may have poor endurance if the value of N is too great. In such memories, N may be relatively small, for example N=4). In some three dimensional memory systems, such as three dimensional NAND memories, all lower pages may be programmed before any upper pages without adverse consequences.

FIG. 15 shows an example of MLC block operation where update blocks are programmed using a scheme in which lower pages of all word lines are programmed prior to programming any upper pages. Sequential updates from a host are sent to update blocks where they are written in lower pages first. Subsequently, the update blocks may be consolidated using data from an original block to fill upper pages and any remaining unfilled lower pages. Data from a closed update block may be copied to an update of update block. Such copying may be relatively fast when only lower page data is copied, which is more common using a lower page first scheme such as that of FIG. 12.

While the schemes of FIGS. 13 and 14 provide a time saving for programming blocks that are only partially filled before they are reclaimed there is no saving if the scheme is used for blocks that are filled. In some cases, MLC blocks may be programmed with two or more different schemes and the scheme of FIG. 13 may be limited to certain blocks that are likely to be only partially filled while one or more other schemes are used for other MLC blocks. Consolidation generally fills a block so that there is no time saving to be obtained from applying the lower page first scheme to copying operations for consolidating valid data. Accordingly, different schemes may be applied when copying such data.

In some memory systems, data of two or more logical pages may be programmed to a physical page together in a single pass. For example, U.S. patent application Ser. No. 13/788,415, entitled. "Write sequence providing write abort protection," filed on Mar. 7, 2013, describes such programming (sometimes referred to as "Full Sequence Programming" or "FSP"). Rather than programming lower page data first, bringing some cells from the erased state to a programmed state (or intermediate state), and later programming upper page data by bringing cells to A, B, and C states, cells are brought from the erased state to A, B, and C states in a single pass. This may provide some time saving compared with separate programming of lower pages and upper pages. For example, in certain memory systems, FSP takes approximately the same amount of time as upper page programming, $T_{UP}$. Thus, using FSP may save the time associated with lower page programming, $T_{LP}$, saving 25% or more in programming time compared with separate lower page and upper page programming.

FIG. 16 shows an example where an update block had lower pages of word lines 0-N programmed and was then closed. After the update block is closed for newly received data, previously stored data may be copied from elsewhere in the memory array to the block in order to consolidate valid data. Unwritten word lines WLN+1 to WLK are written using FSP as indicated by FSP1-FSP(K-N). Thus, a very different programming scheme is implemented for this copy operation in order to efficiently fill the unused space. In many cases, it is desirable to keep logically related data together in a block so that WLN+1 to WLK are filled with data that is logically related to the data stored in lower pages of WL0-WLN. In other cases, these portions of data may not be logically related. In general, with different portions of data stored within a block, some record is kept to indicate where the different portions are located (e.g. which word lines contain logical pages 0-N, and which contain FSP1-FSP(K-N)).

After unwritten word lines are filled using FSP as shown in FIG. 16, unused upper page capacity along word lines WL0-WLN may be filled as shown in FIG. 17 so that the entire capacity of the block is used. In other cases, unused upper page capacity along word lines WL0-WLN is filled before unwritten word lines WLN+1-WLK are filled using FSP. The upper page data may be logically related to lower page data and/or FSP data in some cases, or may be unrelated.

FIG. 18 illustrates handling of newly-received data according to an example. New data is received from a host 820. A determination is made as to whether the data is sequential data of more than a certain length 822. If it is not (i.e. it is a relatively small fragment) then it is written to SLC (e.g. to binary cache) 824. If it is sequential data of more than a threshold amount then it is written to an MLC update block (or update of update block) 826. Writing of lower pages precedes writing of upper pages so that many, or all, lower pages are written before upper pages are written 828. Thus, FIG. 18 illustrates one example of a type of block that may benefit from aspects of the present invention.

FIG. 19 illustrates MLC update block management according to an example. Data is received from a host that overlaps the logical address range of data already stored in an update block 930. An update of update block is opened 932, and the newly received data is written to the update of update block 934. The update block, which contains data that is now obsolete, is closed to newly received data 936.

Figure 20:
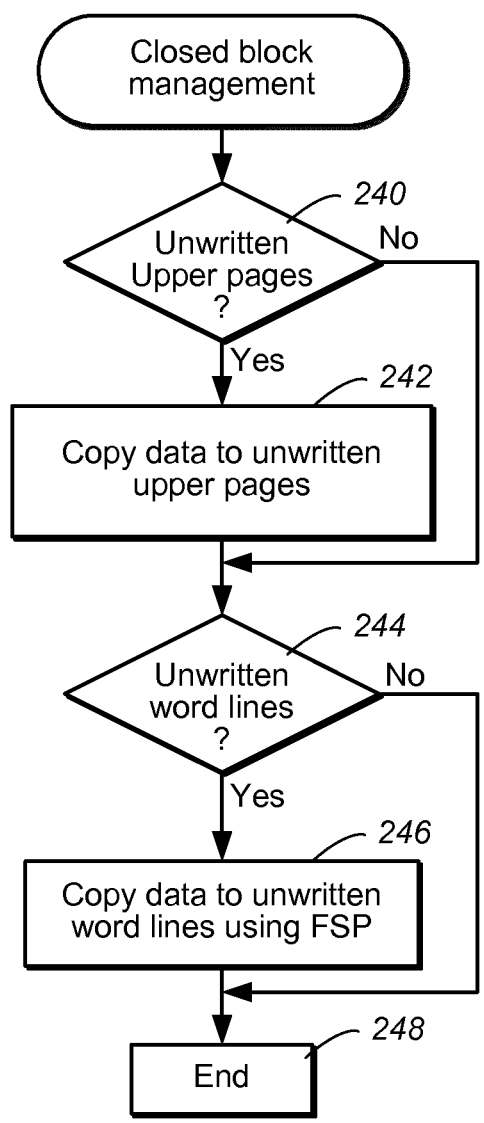
FIG. 20 illustrates management of closed blocks.

FIG. 20 illustrates how closed update blocks may be managed. If there are unwritten upper pages in the block 240 then data may be copied to the unwritten upper pages 242. Subsequently, a determination is made as to whether there are unwritten word lines 244, or more than a threshold number of unwritten word lines. If there are unwritten word lines then data is copied to these word lines using FSP 246. If there are no unwritten word lines then the copying ends 248.

It will be understood that the above description includes a number of examples that relate to specific memory systems (with binary cache, update blocks, update of update blocks, etc.) and how different data (sequential and nonsequential) may be treated in such systems. These examples are for illustration and aspects of the present invention are not limited to any particular memory system, or any particular data structures. For example, aspects of the present invention are not limited to sequential data but may apply to any data, including nonsequential data, which is stored in a manner that is likely to leave significant unwritten capacity in the block when it is reclaimed.

Figure 21:
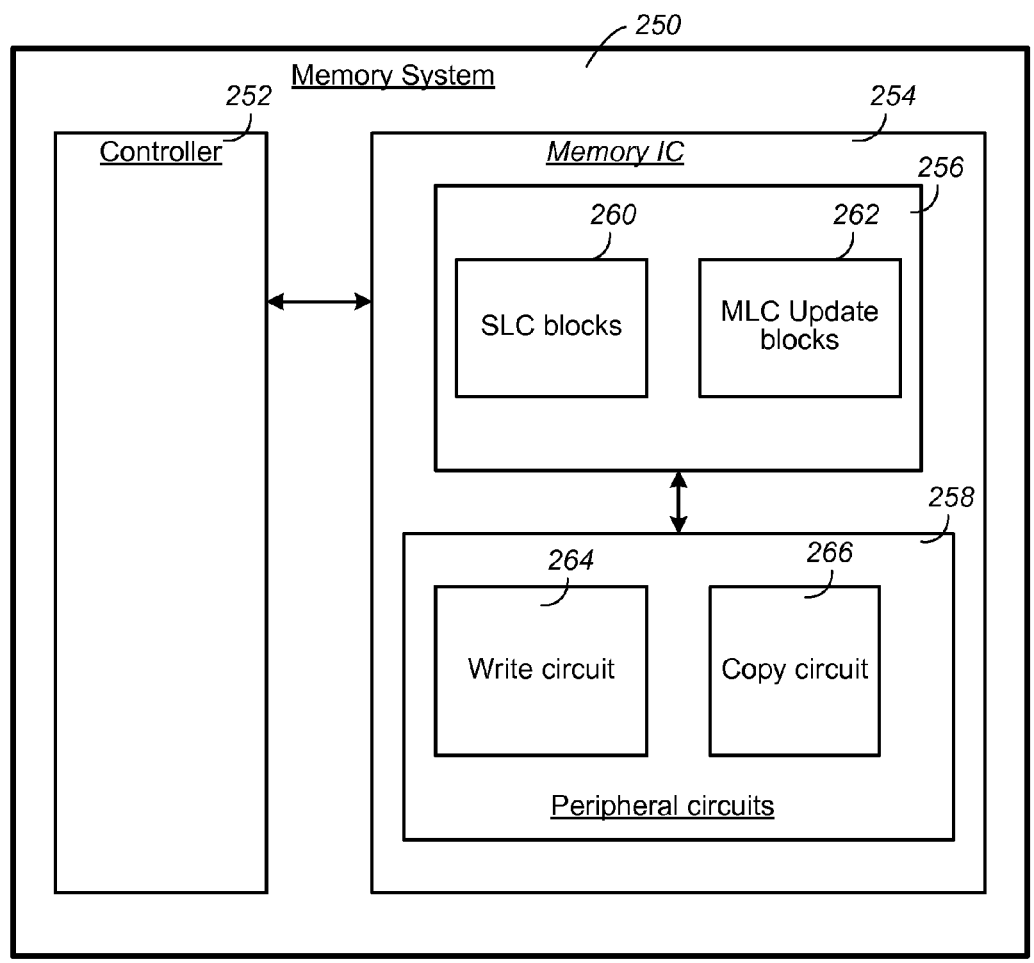
FIG. 21 illustrates an example of memory system hardware.

FIG. 21 shows hardware that may be used to implement aspects of the present invention. A memory system 250 contains a controller 252 and a memory IC 254. The memory IC 254 contains a nonvolatile memory array 256 (e.g. planar or 3-D NAND flash memory array) and peripheral circuits 258. The memory array includes SLC blocks 260 and MLC blocks 262. These blocks are not necessarily configured permanently as either SLC or MLC but may be reconfigured from one to the other. While many of the MLC blocks may be used for long term storage and may generally be filled, some MLC blocks (e.g. update blocks) may be operated so that they are often unfilled at the time that they become obsolete. These blocks may be operated using a lower page first scheme in which lower page programming precedes upper page programming significantly. In some cases, all lower page programming in such a block occurs before any upper page programming. Peripheral circuits 258 include a write circuit 264 that is configured to program word lines of certain MLC blocks so that lower page programming precedes upper page programming by a number of word lines (e.g. four word lines, or by the number of word lines in the block). Peripheral circuits 258 also include a copy circuit 266 that is configured to copy previously stored data to unused word lines using FSP and to fill any unwritten upper pages.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

The invention claimed is:

1. A method of operating a block-erasable three-dimensional NAND flash memory array comprising:
  maintaining a plurality of Multi Level Cell (MLC) erase blocks as update blocks that are available to receive data updates of host data for particular host logical address ranges;
  programming newly-received host data to word lines of an individual update block in a first order in which lower page programming of the word lines of the update block precedes upper page programming of the word lines of the update block by X word lines, where X is equal to the number of word lines in the individual update block
  subsequent to programming a subset of word lines consisting of fewer than all word lines of the individual update block with lower page data, ceasing programming of newly received host data in the individual update block according to the first order; and
  subsequently copying data from outside the individual update block to unprogrammed word lines of the individual update block according to a second order in which lower page programming and upper page programming are performed together for a given word line.

2. The method of claim 1 wherein, in the second order, lower page programming and upper page programming for the given word line are performed together in a single-pass that brings cells along the word line from an erased condition to a condition in which an individual memory cell stores two or more bits of data.

3. The method of claim 1 further comprising, copying additional data to upper pages of word lines of the subset of word lines.

4. The method of claim 1 wherein the plurality of MLC erase blocks store two logical pages per physical page, a lower page and an upper page.

5. The method of claim 1 wherein the plurality of MLC erase blocks store three logical pages per physical page, a lower page, a middle page, and an upper page.

6. A method of operating a block-erasable nonvolatile memory array comprising:
  maintaining a plurality of Single Level Cell (SLC) erase blocks to receive nonsequential data updates of host data;
  maintaining a first plurality of Multi Level Cell (MLC) erase blocks as update blocks that are available to store newly-received sequential data updates of host data for particular host logical address ranges;
  programming newly-received sequential host data to word lines of an individual update block in a first order in which lower page programming of all of the word lines precedes upper page programming of the word lines;
  writing first sequential data to a first update block when the first sequential data is received for a first host logical address range associated with the first update block, the first sequential data written entirely in lower pages of the first update block;
  subsequently, closing the first update block to newly-received host data and opening a second update block when second sequential data is received for a second host logical address range that overlaps the first host logical address range;
  writing the second sequential data to the second update block; and
  subsequently copying additional data from elsewhere in the memory array to the closed first update block, the additional data written along unprogrammed word lines of the first update block in a programming scheme in which lower page programming and upper page programming are performed together for a given word line.

7. A nonvolatile memory system comprising:
  a nonvolatile three-dimensional NAND memory array that includes a plurality of Multi Level Cell (MLC) nonvolatile memory blocks that are configured as update blocks that are available to receive data updates of host data for a particular host logical address range; and
  a write circuit that is configured to program newly-received host data to word lines of an individual update block in a first order in which lower page programming of the word lines precedes upper page programming of the word lines by X word lines, where X is equal to the number of word lines in an update block; and
  a copy circuit configured to copy previously stored data to unused word lines of an update block that is closed to newly-received host data in a second order in which upper page programming and lower page programming are performed together.

8. The nonvolatile memory system of claim 7 wherein the copy circuit is further configured to copy previously stored data as upper page data of word lines of the update block that were previously programmed with only lower page data.

* * * * *